(12) United States Patent
Numata

(10) Patent No.: US 12,144,050 B2
(45) Date of Patent: Nov. 12, 2024

(54) BATTERY MONITORING APPARATUS

(71) Applicant: DENSO CORPORATION, Kariya (JP)

(72) Inventor: Tatsuhiro Numata, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 18/533,624

(22) Filed: Dec. 8, 2023

(65) Prior Publication Data

US 2024/0114580 A1 Apr. 4, 2024

Related U.S. Application Data

(63) Continuation of application No. 17/473,584, filed on Sep. 13, 2021, which is a continuation of application No. PCT/JP2020/010015, filed on Mar. 9, 2020.

(30) Foreign Application Priority Data

Mar. 13, 2019 (JP) ................................. 2019-045836
Oct. 23, 2019 (JP) ................................. 2019-192981

(51) Int. Cl.
*G01R 31/382* (2019.01)
*G01R 31/3835* (2019.01)
*H01M 6/50* (2006.01)
*H01M 10/48* (2006.01)
(Continued)

(52) U.S. Cl.
CPC ........ *H04W 76/19* (2018.02); *G01R 31/3835* (2019.01); *H01M 10/48* (2013.01); *H04W 4/40* (2018.02)

(58) Field of Classification Search
CPC ...... H01M 6/50; H01M 6/5083; H01M 10/42; H01M 10/48; H04W 4/30; H04W 4/38; H04W 4/40; H04W 76/19; G01R 31/382; G01R 31/3835
See application file for complete search history.

(56) References Cited

U.S. PATENT DOCUMENTS

| 10,416,239 B2 * | 9/2019 | Mizobe .................... H02J 7/04 |
| 11,011,917 B2 * | 5/2021 | Park ..................... H01M 10/482 |
| 2003/0011472 A1 | 1/2003 | Itou et al. |

(Continued)

FOREIGN PATENT DOCUMENTS

JP 2013-140055 A 7/2013

Primary Examiner — Blane J Jackson
(74) Attorney, Agent, or Firm — Oliff PLC

(57) ABSTRACT

A battery monitoring apparatus includes a battery ECU, a plurality of voltage monitors, and a wireless device. The wireless device contains a main unit disposed to the battery ECU and sub units disposed to the corresponding voltage monitors. In response to establishment of communication connection of wireless communication between the main unit and the sub units, the main unit wirelessly transmits a command by the battery ECU to the sub units, and the sub units wirelessly transmit voltage information detected by the voltage monitors to the main unit. The wireless device acquires voltage monitor information prior to establishment of initial communication connection, and establishes communication connection based on the voltage monitor information. The battery ECU or each voltage monitor is provided with a storage unit configured to store voltage monitor information. At re-connection, the wireless device performs communication re-connection using the voltage monitor information stored in the storage unit.

28 Claims, 13 Drawing Sheets

(51) Int. Cl.
 *H04W 4/40* (2018.01)
 *H04W 76/19* (2018.01)

(56) References Cited

U.S. PATENT DOCUMENTS

| | | |
|---|---|---|
| 2012/0299377 A1 | 11/2012 | Masuda et al. |
| 2016/0268642 A1* | 9/2016 | Yamazoe ............ H01M 10/425 |
| 2019/0237816 A1* | 8/2019 | Kim .................... H01M 10/482 |
| 2020/0036194 A1 | 1/2020 | Park et al. |
| 2020/0200828 A1 | 6/2020 | Sung |
| 2021/0410222 A1 | 12/2021 | Numata |
| 2023/0068623 A1 | 3/2023 | Kim et al. |

* cited by examiner

FIG.13
(SECOND COMMUNICATION MODE)
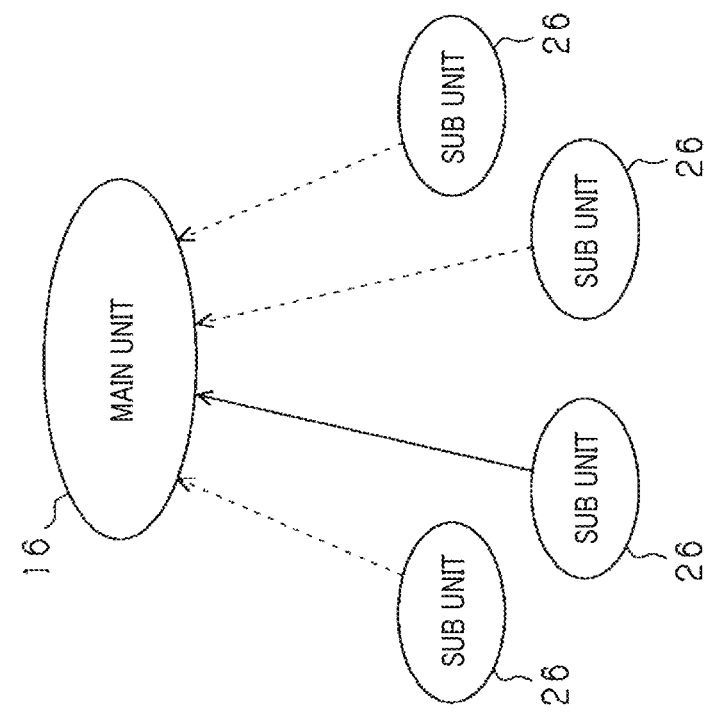
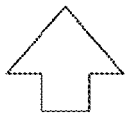
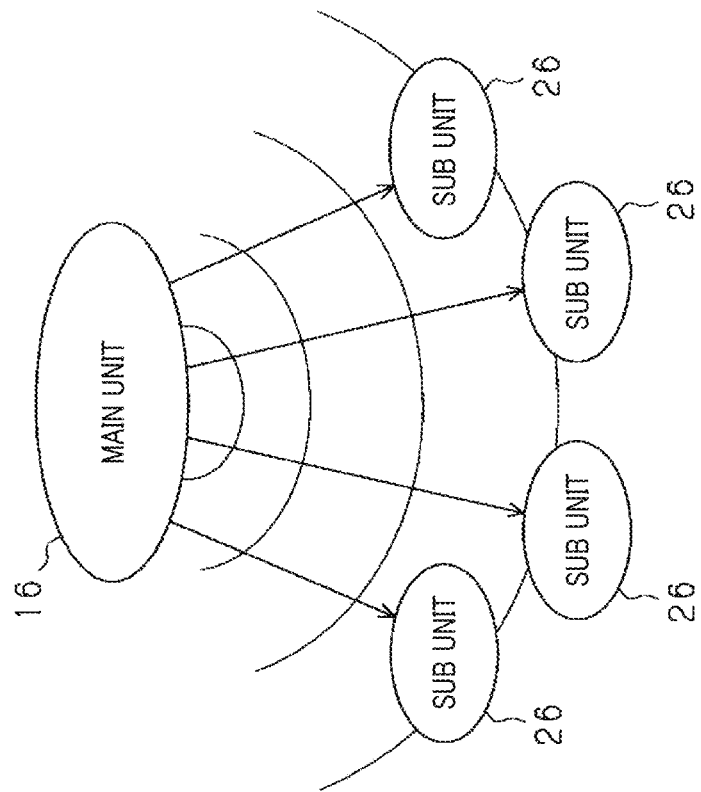

BATTERY MONITORING APPARATUS

CROSS-REFERENCE TO RELATED APPLICATIONS

This application is a continuation of U.S. patent application Ser. No. 17/473,584, filed Sep. 13, 2021, which is a U.S. bypass application of International Application No. PCT/JP2020/010015 filed on Mar. 9, 2020 which designated the U.S. and claims priority to Japanese Patent Application No. 2019-045836 filed on Mar. 13, 2019 and Japanese Patent Application No. 2019-192981 filed on Oct. 23, 2019, the contents of all of which are incorporated herein by reference.

TECHNICAL FIELD

The present disclosure relates to a battery monitoring apparatus configured to monitor a plurality of unit batteries provided to a battery pack mounted on a vehicle.

BACKGROUND

Some battery monitoring apparatuses include a battery ECU and a plurality of voltage monitors, and perform wireless communication between the battery ECU and the voltage monitors. The voltage monitors are disposed to corresponding battery blocks into which the plurality of unit batteries is grouped. The battery ECU wirelessly transmits a command to the voltage monitors. Each voltage monitor detects voltage information of the unit batteries and wirelessly transmits the detected information to the battery ECU. An example in the literature of a battery monitoring apparatus configured to perform wireless communication in this manner is JP 6093448 B.

SUMMARY

The battery monitoring apparatus according to the present disclosure is an apparatus configured to monitor a plurality of unit batteries provided to a battery pack mounted on a vehicle, and includes a battery ECU, voltage monitors, and a wireless device. The voltage monitors are disposed to corresponding battery blocks into which a plurality of the unit batteries is grouped, to detect voltage information of the unit batteries. The wireless device contains a main unit disposed to the battery ECU and sub units disposed to the corresponding voltage monitors. In response to establishment of communication connection of wireless communication between the main unit and the sub units in the wireless device, the main unit wirelessly transmits a command by the battery ECU to the sub units, and the sub units wirelessly transmit the voltage information to the main unit.

The main unit receives wireless signals from the sub units prior to initial establishment of the communication connection, such that the wireless device acquires voltage monitor information, which is information of the voltage monitors, and establishes the communication connection using the voltage monitor information.

At least one of the battery ECU and each voltage monitor is disposed with a storage unit to store the voltage monitor information. At a time of re-connection in which communication re-connection is reestablished after disconnection of the initial communication connection, the wireless device establishes the communication re-connection using the voltage monitor information stored in the storage unit.

BRIEF DESCRIPTION OF THE DRAWINGS

The above features of the present disclosure will be made clearer by the following detailed description, given referring to the appended drawings. In the accompanying drawings:

FIG. 13 is a schematic diagram illustrating a first communication mode and a second communication mode in a sixth embodiment.

DETAILED DESCRIPTION OF THE PREFERRED EMBODIMENTS

Figure 1:
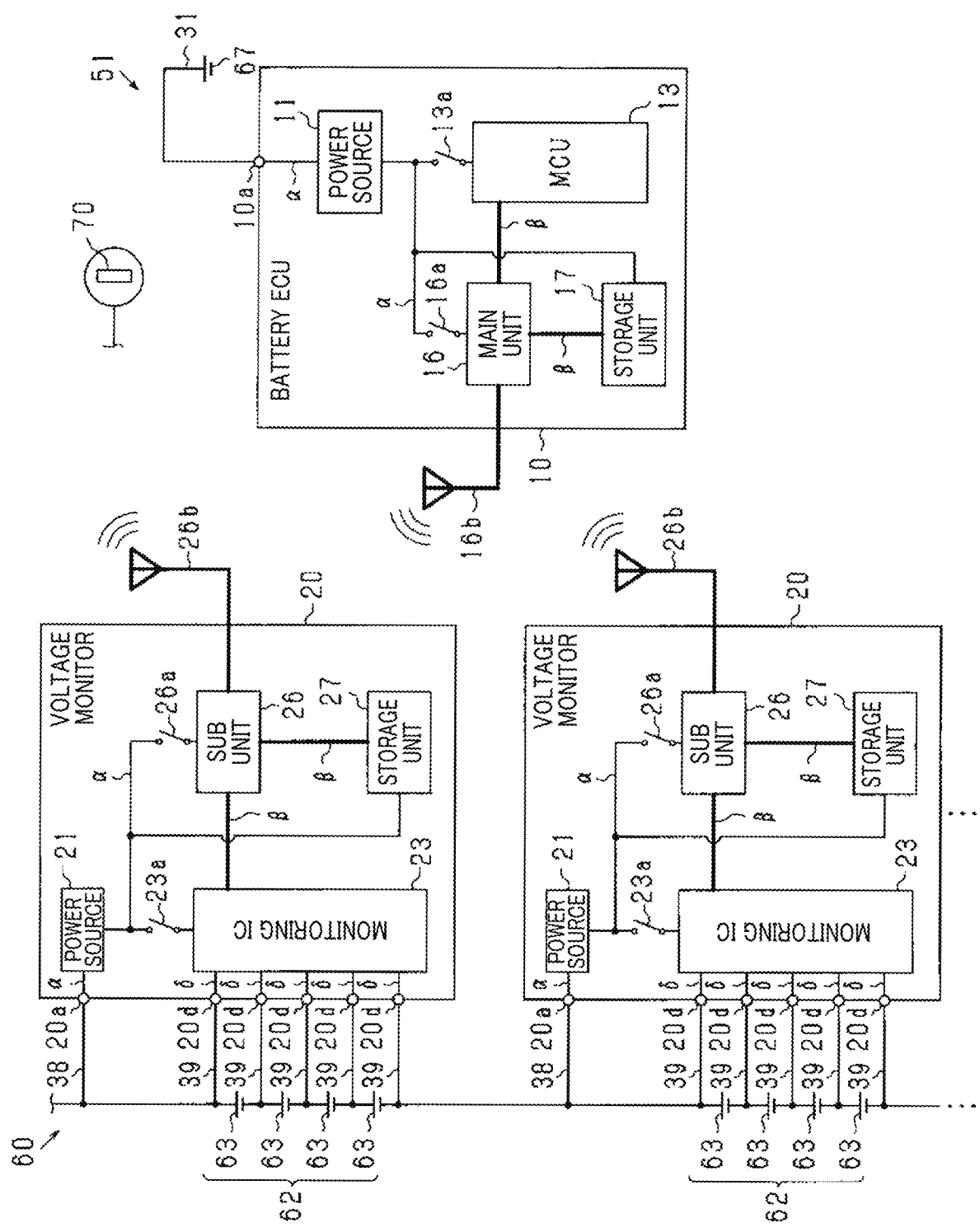
FIG. 1 is a circuit diagram illustrating a battery monitoring apparatus according to a first embodiment.

Usually, a battery monitoring apparatus needs to confirm that a battery pack is normal before departure of a vehicle. Therefore, communication connection between a battery ECU and voltage monitors needs to be established to detect voltages of unit batteries, before departure of a vehicle. In this regard, a known wireless-type battery monitoring apparatus, such as disclosed in JP 6093448 B, activates a battery ECU and voltage monitors in response to a power switch of a vehicle being turned ON, and starts connection processing for wireless communication. However, a time taken for the connection processing of wireless communication is often longer than that for connection processing of wired communication. This lengthens a time from when a power switch of a vehicle is turned on by a driver to when the vehicle becomes ready to move. As a result, comfort of a driver deteriorates.

In addition, if connection of wireless communication is unintentionally disconnected while a power switch of a vehicle is ON, communication re-connection also comes to take time, because connection of wireless communication often takes time as described above.

The present disclosure has been made in view of the above-described situation, and has as its main object to provide a battery monitoring apparatus which can smoothly perform connection of wireless communication.

The battery monitoring apparatus according to the present disclosure is an apparatus configured to monitor a plurality of unit batteries provided to a battery pack mounted on a vehicle, and includes a battery ECU, voltage monitors, and a wireless device. The voltage monitors are disposed to corresponding battery blocks into which a plurality of the unit batteries is grouped, to detect voltage information of the unit batteries. The wireless device contains a main unit disposed to the battery ECU and sub units disposed to the corresponding voltage monitors. In response to establishment of communication connection of wireless communication between the main unit and the sub units in the wireless device, the main unit wirelessly transmits a command by the battery ECU to the sub units, and the sub units wirelessly transmit the voltage information to the main unit.

The main unit receives wireless signals from the sub units prior to initial establishment of the communication connection, such that the wireless device acquires voltage monitor information, which is information of the voltage monitors, and establishes the communication connection using the voltage monitor information.

At least one of the battery ECU and each voltage monitor is disposed with a storage unit to store the voltage monitor information. At a time of re-connection in which communication re-connection is reestablished after disconnection of the initial communication connection, the wireless device establishes the communication re-connection using the voltage monitor information stored in the storage unit.

According to the present disclosure, the following effects are obtained. Since the wireless device establishes communication connection using voltage monitor information, communication connection can be appropriately established depending on voltage monitor information. However, if it takes time to acquire voltage monitor information, it takes time to establish communication connection.

In this regard, the present disclosure is configured that communication re-connection is performed using voltage monitor information stored in the storage unit at a time of re-connection, with the result that although a time for acquiring voltage monitor information is necessary at an initial communication connection, a time for acquiring voltage monitor information is reduced at the subsequent re-connections. Accordingly, a second or later communication connection can be smoothly reestablished.

Next, embodiments of the disclosure will be described with reference to the drawings. However, the present disclosure is not limited to aspects of the embodiments, which can be appropriately modified and carried out within a scope that does not depart from the purpose of the disclosure.

First Embodiment

FIG. 1 is a circuit diagram illustrating a battery monitoring apparatus 51 and its peripheries according to a first embodiment. A vehicle includes a power switch 70, a battery pack 60, an auxiliary battery 67, and a battery monitoring apparatus 51, and is further provided with power lines 31 and 38 and a detection line 39. The battery pack 60 contains a plurality of unit batteries 63. The plurality of unit batteries 63 is grouped into a plurality of battery blocks 62. The battery monitoring apparatus 51 includes a battery ECU 10 and a plurality of voltage monitors 20.

The battery ECU 10 contains a power source 11, an MCU 13, a main unit 16, and a storage unit 17, and is further provided with a power port 10a, an electrical wire a, and a communication wire 13. The MCU 13 has a power switch 13a. The main unit 16 has a power switch 16a and an antenna 16b.

Each voltage monitor 20 includes a power source 21, a monitoring IC 23, a sub unit 26, and a storage unit 27, and is further provided with a power port 20a, a plurality of detection ports 20d, an electrical wire a, a communication wire 13, and a detection wire 6. The monitoring IC 23 has a power switch 23a. The sub unit 26 has a power switch 26a and an antenna 26b.

Next, the above-described members and others will be described. The power switch 70 is an activation switch of a power unit for running a vehicle. The power unit of a vehicle may be one or both (a hybrid) of an engine and a motor.

A plurality of battery blocks 62 is connected in series. Each battery block 62 is constituted by a plurality of unit batteries 63 connected in series. Each unit battery 63 may be a single cell battery or a plurality of cell batteries connected in series. Although the cell battery is a lithium battery in the present embodiment, other batteries may be used.

The auxiliary battery 67 is connected to the power port 10a of the battery ECU 10 via a power line 31. The power source 11 is connected to the power port 10a, the MCU 13, the main unit 16, and the storage unit 17 via the electrical wires a. The power source 11 supplies power supplied from the auxiliary battery 67 to the MCU 13, the main unit 16, and the storage unit 17.

The power switch 13a switches ON/OFF power supplied from the electrical wire a to the MCU 13. The power switch 16a switches ON/OFF power supplied from the electrical wire a to the main unit 16. In response to the power switch 70 being turned ON, the power switches 13a and 16a of the MCU 13 and the main unit 16 are turned ON. Accordingly, the battery ECU is activated. On the other hand, in response to the power switch 70 being turned OFF, the power switches 13a and 16a of the MCU 13 and the main unit 16 are thereafter turned OFF. Accordingly, the battery ECU 10 is placed in a sleep mode. The sleep mode is a state in which although activation of the MCU 13 and the main unit 16 are terminate, activation of the storage unit 17 is not terminated.

The MCU 13, for example, gives a command to the monitoring IC 23. Examples of such a command include a command to acquire voltage information of the unit batteries 63 and a command to discharge the unit batteries 63. The main unit 16 contains a communication controller and an RF part. The MCU 13 and the main unit 16 are communicably connected via the communication wire 13. The MCU 13 transmits to the main unit 16, for example, a command for the monitoring IC 23, via the communication wire 13. On the other hand, the main unit 16 transmits, for example, voltage information wirelessly received from the sub units 26, to the MCU 13 via the communication wire 13. The storage unit 17 has a memory.

The battery pack 60 is connected to the power port 20a of each voltage monitor 20 via the power line 38. The power source 21 is connected to the power port 20a, the monitoring IC 23, the sub unit 26, and the storage unit 27 via the electrical wires a. The power source 21 supplies power supplied from the unit batteries 63, to the monitoring IC 23, the sub unit 26, and the storage unit 27.

The power switch 23a switches ON/OFF power supplied from the electrical wire a to the monitoring IC 23. The power switch 26a switches ON/OFF power supplied from the electrical wire a to the sub unit 26. In response to the power switch 70 being turned ON, the power switches 23a and 26a of the monitoring IC 23 and the sub unit 26 are turned ON. Accordingly, the voltage monitor 20 is activated. On the other hand, in response to the power switch 70 being turned OFF, the power switches 23a and 26a of the monitoring IC 23 and the sub unit 26 are thereafter turned OFF. Accordingly, the voltage monitor 20 is placed in a sleep mode. The sleep mode is a state in which although activation of the monitoring IC 23 and the sub unit 26 are terminated, activation of the storage unit 27 is not terminated.

The monitoring IC 23 is connected to each detection port 20d via the detection wire 6. The plurality of detection ports 20d are connected, via the detection lines 39, to both ends of the battery block 62 and between terminals of the plurality of unit batteries 63 constituting the battery block 62. The monitoring IC 23 can detect voltage information between the terminals of the unit batteries 63. The voltage information may be an actual voltage value, or may be, for example, information convertible to a voltage value, such as a current value flowing through a prescribed portion. The monitoring IC 23 can discharge the unit batteries 63, as necessary. Therefore, a balancing treatment can be performed in which the charging states of the unit batteries 63 are uniformized.

The sub unit 26 has a communication controller and an RF part. The monitoring IC 23 and the sub unit 26 are communicably connected via the communication wire 13. The sub unit 26 transmits, for example, a command wirelessly received from the main unit 16, to the monitoring IC 23 via the communication wire 13. On the other hand, the monitoring IC 23 transmits voltage information or the like to the sub unit 26 via the communication wire 13. The storage unit 27 has a memory. The main unit 16 and the sub units 26 constitute a wireless device.

Next, control of the battery monitoring apparatus 51 will be described separately at an initial operation and at a second operation or later. At an initial operation, the power switch 70 is turned ON for the first time to operate the battery monitoring apparatus 51, after the battery monitoring apparatus 51 has been mounted on a vehicle. At a second operation or later, the power switch 70 is turned ON for the second time or later to operate the battery monitoring apparatus 51, after the battery monitoring apparatus 51 has been mounted on a vehicle.

Figure 2:
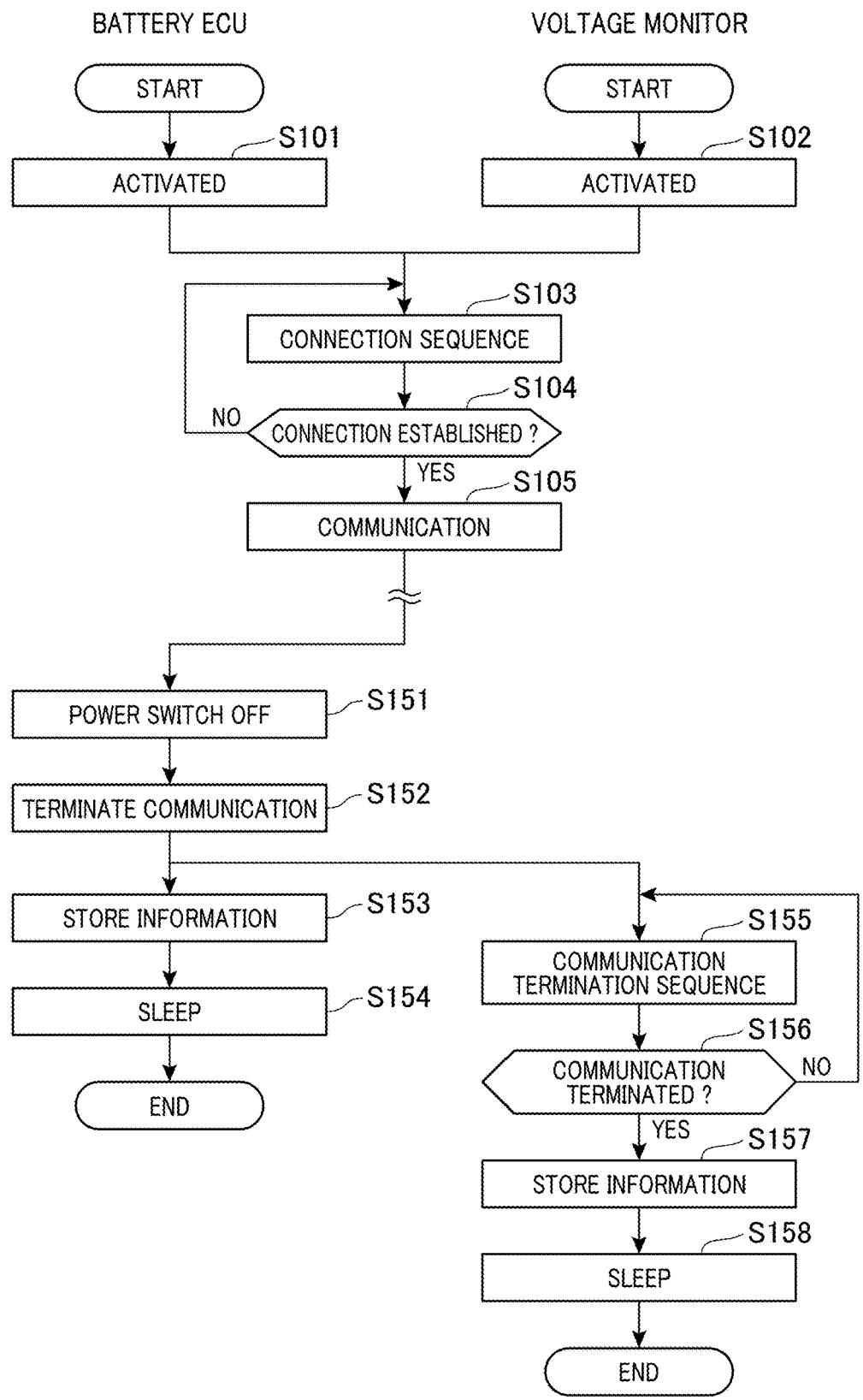
FIG. 2 is a flowchart illustrating a processing flow at an initial operation.

FIG. 2 is a flowchart illustrating control of the battery monitoring apparatus 51 at an initial operation. Firstly, a processing flow in response to the power switch 70 being turned ON will be described. In response to the power switch 70 being turned ON, the battery ECU 10 is activated (S101), while the voltage monitors 20 are also activated (S102). Thereafter, the main unit 16 and the sub units 26 perform a connection sequence (S103) to establish communication connection. Next, it is determined whether the main unit 16 and the sub units 26 have established communication connection (S104). In response to determining that communication connection has not been established (S104: NO), the connection sequence in S103 is performed again. On the other hand, in response to determining that communication connection has been established (S104: YES), wireless communication is performed between the main unit 16 and the sub units 26 (S105).

Particularly, in the activation of the battery ECU 10 in S101, the power switches 13a and 16a are turned ON to activate the MCU 13 and the main unit 16. In addition, in the activation of each voltage monitor 20 in S102, the power switches 23a and 26a are turned ON to activate the monitoring IC 23 and the sub unit 26.

In the connection sequence in S103, the main unit 16 and the sub units 26 exchange information through wireless signals. Accordingly, the main unit 16 and the sub units 26 establish information such as connection information and voltage monitor information. The connection information is information on identification numbers of the main unit 16 and the sub units 26, frequency channels used for wireless communication, data structures of data to be communicated, and the like.

On the other hand, the voltage monitor information is information based on the below-described number information, position information, and period information. Particularly, the voltage monitor information may contain number information itself, position information itself, and period information itself, or may contain information such as calculated values based thereon.

The number information is information indicating the number of voltage monitors 20. The main unit 16 acquires number information, because, for example, the number of sub units 26 to be sequentially communicated by the main unit 16 may vary depending on the number of voltage monitors 20. The sub units 26 acquire number information, because, for example, the interval at which the sub units 26 themselves communicate with the main unit 16 may vary depending on the number of voltage monitors 20. For acquiring the number information, for example, the sub units 26 transmit their identification numbers to the main unit 16 through wireless signals, and the main unit 16 counts the number of sub units 26 from the number of received identification numbers. Furthermore, in order that the sub units 26 can also acquire the number information, the main unit 16 wirelessly transmits the acquired number information to the sub units 26.

The position information is information indicating to which of the battery blocks 62 each voltage monitor 20 is disposed. The main unit 16 acquires position information, because, for example, which of the battery blocks 62 corresponds to received voltage information to be processed may vary depending on the position of the voltage monitor 20. Each sub unit 26 acquires position information, because, for example, the address in the main unit 16 to which the sub unit 26 transmits voltage information may vary depending on the position of its corresponding voltage monitor 20.

The position information can be acquired in the following manner. For example, each voltage monitor 20 detects a potential difference between the potential of the battery block 62 corresponding to itself and the ground potential, and wirelessly transmits the detected potential difference to the main unit 16, so that the main unit 16 can acquire position information (order) of the voltage monitor 20 to which each sub unit 26 belongs. The acquired position information is wirelessly transmitted from the main unit 16 to the sub units 26, so that the sub units 26 can also acquire position information. In addition, for example, an assembly worker or the like stores position information in each voltage monitor 20 when assembling the voltage monitor 20, and the sub unit 26 wirelessly transmits the stored position information to the main unit 16 during the connection sequence, so that the sub unit 26 and the main unit 16 can acquire position information. In addition, for example, the voltage monitors 20 are sequentially activated in the ascending order of the potentials of the corresponding battery blocks 62, and the sub units 26 sequentially transmit their own identification numbers to the main unit 16 through wireless signals in the activated order of the voltage monitors 20, so that the main unit 16 can acquire position information (order) of the voltage monitors 20 to which the corresponding sub units 26 belong. In addition, the main unit 16 wirelessly transmits the acquired position information to the sub units 26, so that the sub units 26 can also acquire position information.

The period information is information indicating an acquisition period of voltages of the unit batteries 63 by the voltage monitors 20. The main unit 16 and the sub units 26 acquire period information, because, for example, the length of the period of communication between the main unit 16 and the sub units 26 may vary depending on the acquisition period of voltages. For example, when the acquisition period is intrinsic to each monitoring IC 23, each sub unit 26 acquires the ID of the monitoring IC 23 of the corresponding voltage monitor 20, and transmits the acquired ID to the main unit 16 through wireless signals, so that the main unit 16 can acquire the period information of the voltage monitor 20. In addition, the main unit 16 wirelessly transmits the period information to each sub unit 26, so that each sub unit 26 can also acquire period information of other sub units 26.

In the connection sequence of S103, the main unit 16 and the sub units 26 establish communication connection based on the acquired connection information and voltage monitor information. In response to the establishment of communication connection, the main unit 16 wirelessly transmits a command by the MCU 13 to the sub units 26, and the sub units 26 wirelessly transmit voltage information and the like to the main unit 16, through the communication in S105.

Next, a processing flow in response to the power switch 70 being turned OFF will be described. In response to the power switch 70 being turned OFF (S151), the main unit 16 terminates wireless communication with the sub units 26 (S152). Thereafter, the main unit 16 stores connection information and voltage monitor information in the storage unit 17 (S153). Then, the battery ECU 10 is placed in a sleep mode (S154).

On the other hand, the sub units 26 terminate wireless communication with the main unit 16 (S152), thereafter perform a communication termination sequence (S155), and determine whether the communication with the main unit 16 has been terminated (S156). In response to failing to determine that the communication has been terminated (S156: NO), the communication termination sequence in S155 is repeated. On the other hand, in response to determining that the communication has been terminated (S156: YES), the sub units 26 store information such as connection information and voltage monitor information in the corresponding storage units 27 (S157). Thereafter, the voltage monitors 20 are placed in a sleep mode (S158).

Particularly, in the communication termination of S152, the main unit 16 terminates wireless communication of a command by the MCU 13 to the sub units 26. In the sleep of S154, the power switches 13a and 16a of the MCU 13 and the main unit 16 are turned OFF. In the communication termination sequence of S155, it is determined that the communication has been terminated, in response to the sub units 26 not receiving wireless signals from the main unit 16 for a prescribed time or longer. In the sleep of S158, the power switches 23a and 26a of the monitoring IC 23 and the sub units 26 are turned OFF.

Figure 3:
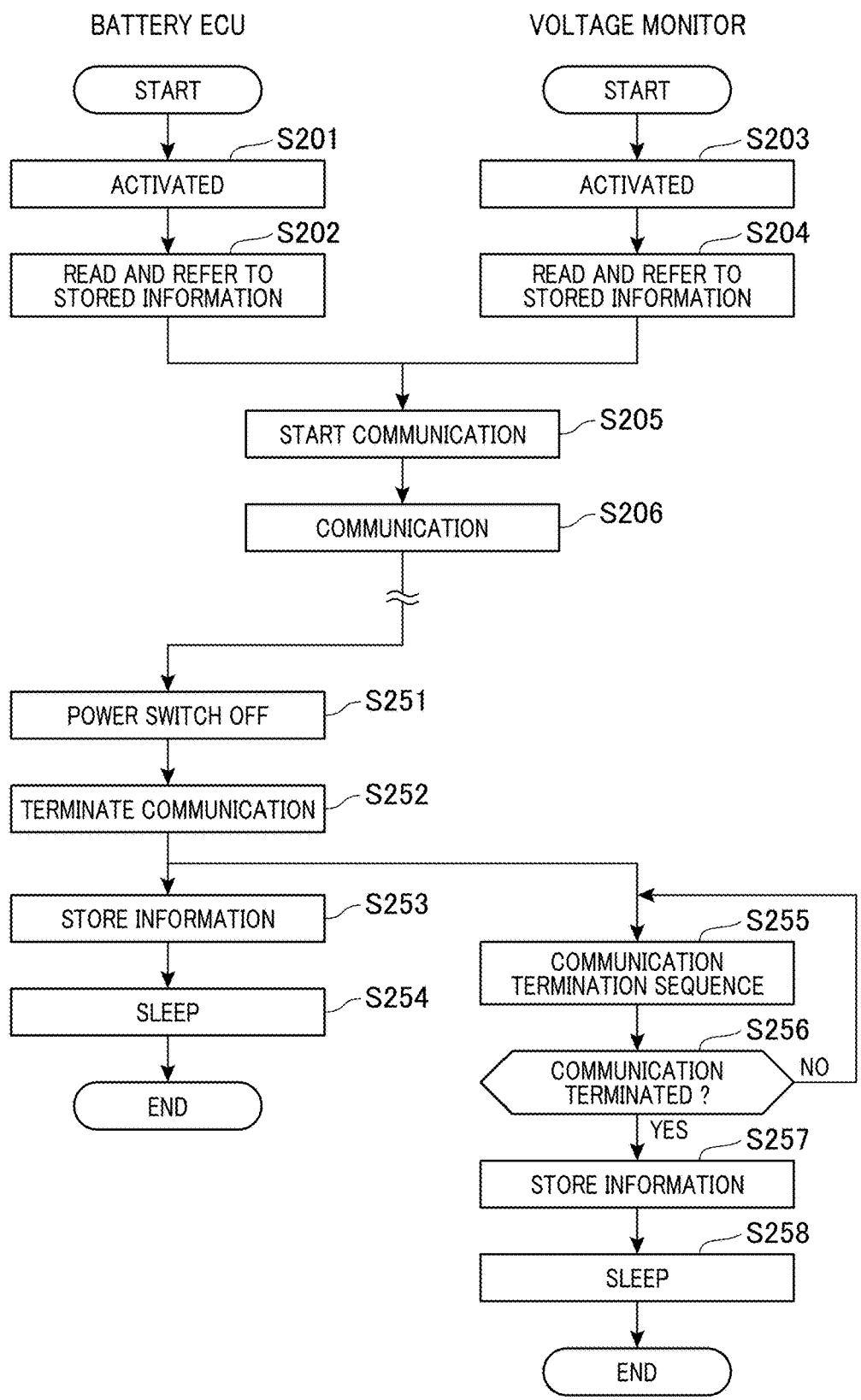
FIG. 3 is a flowchart illustrating a processing flow at a second operation or later.

FIG. 3 is a flowchart illustrating control of the battery monitoring apparatus 51 at a second operation or later. In response to the power switch 70 of a vehicle being turned ON, the battery ECU 10 is activated (S201), while the voltage monitors 20 are activated (S203). The main unit 16 reads and refers to information stored in the storage unit 17 of the battery ECU 10 (S202), and each sub unit 26 reads and refers to information stored in the storage unit 27 of the corresponding voltage monitor 20 (S204). Accordingly, the main unit 16 and the sub unit 26 establish communication connection and start wireless communication (S205) without performing the connection sequence as performed at the initial operation. Then, wireless communication is continued (S206).

The processing flow (S251 to S258) in response to the power switch 70 being turned OFF is the same as at the initial operation (S151 to S158). Therefore, the main unit 16 and the sub units 26 come to update connection information and voltage monitor information stored in the storage units 17 and 27, in response to the power switch 70 of a vehicle being turned OFF.

Figure 4:
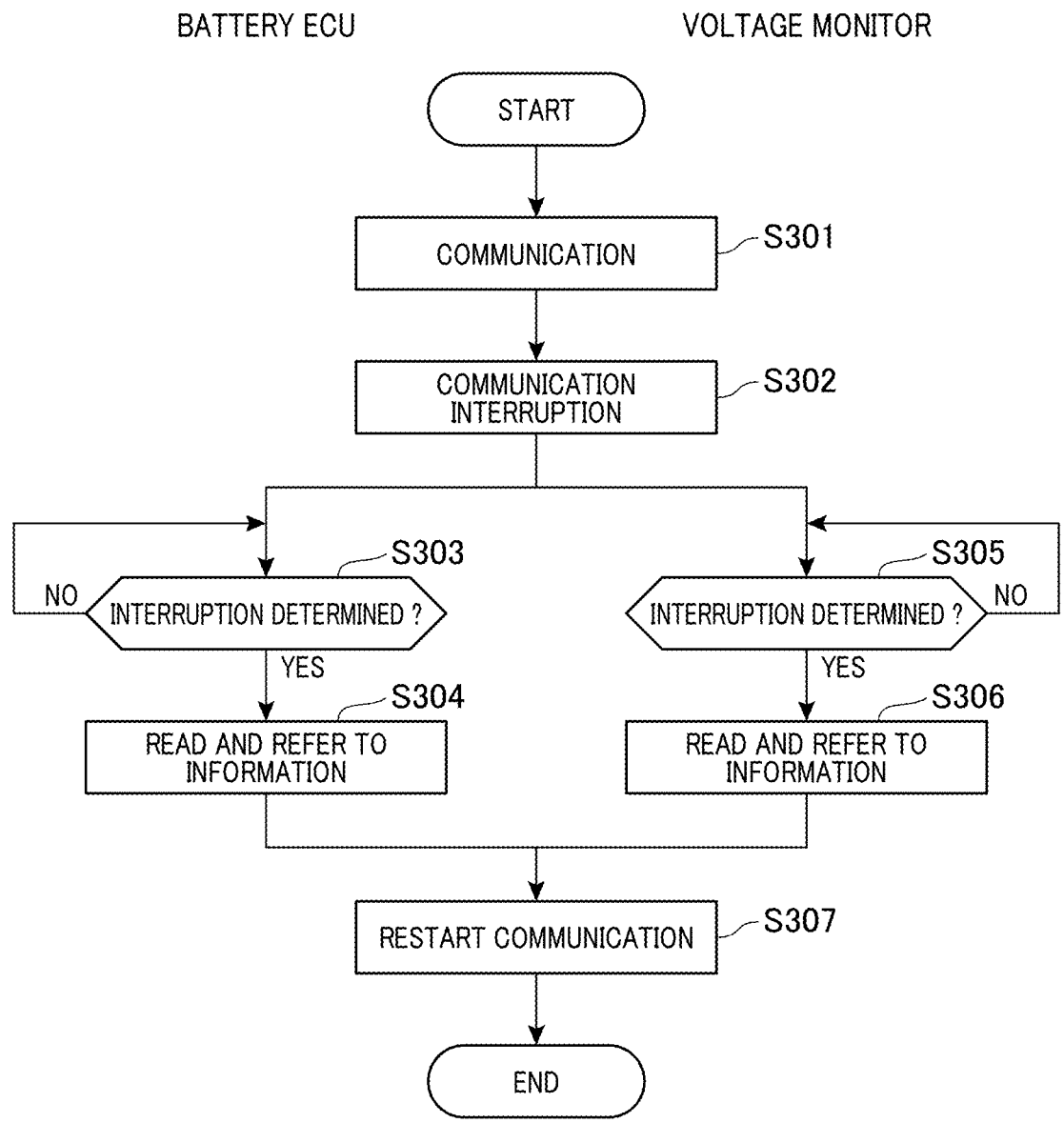
FIG. 4 is a flowchart illustrating a processing flow when communication connection is disconnected during communication.

FIG. 4 is a flowchart illustrating control in response to disconnection of communication connection while the power switch 70 is ON, that is, during communication. In response to occurrence of communication interruption (S302) while wireless communication is performed (S301), the main unit 16 performs interruption determination (S303). In response to failing to determine that interruption has occurred (S303: NO), the interruption determination (S303) is repeated. On the other hand, in response to determining that interruption has occurred in S303 (S303: YES), the main unit 16 reads and refers to information in the storage unit 17 (S304).

In addition, in response to occurrence of communication interruption (S302) while wireless communication is performed (S301), the sub units 26 perform interruption determination (S305). In response to failing to determine that interruption has occurred (S305: NO), the interruption determination (S305) is repeated. On the other hand, in response to determining that interruption has occurred in S305 (S305: YES), the sub units 26 read and refer to information in the corresponding storage units 27 (S306).

Since the main unit 16 and the sub units 26 both read and refer to information in the corresponding storage units 17 and 27, the main unit 16 and the sub units 26 establish communication re-connection and restart wireless communication, without performing the connection sequence as performed at the initial operation (S307).

Particularly, in the interruption determination of S303, the main unit 16 determines that wireless communication has been interrupted, in response to not receiving wireless signals from the sub units 26 for a prescribed time or longer. In addition, in the interruption determination of S305, the sub units 26 determine that wireless communication has been interrupted, in response to not receiving wireless signals from the main unit 16 for a prescribed time or longer.

According to the present embodiment, the following effects are obtained. Since the main unit 16 and the sub units 26 perform communication connection using information stored in the storage units 17 and 27 at a second operation or later, a time for acquiring connection information and voltage monitor information can be saved. Therefore, communication connection at a second operation or later can be smoothly reestablished.

In addition, since the main unit 16 and the sub units 26 perform communication connection using information stored in the storage units 17 and 27 even when communication connection is disconnected during communication, communication re-connection can be smoothly reestablished.

Furthermore, since voltage monitor information stored in the storage units 17 and 27 is based on three of the number information, the position information, and the period information, acquisition of all these three pieces of information can be omitted. This point also facilitates smooth reestablishment of communication connection. The smooth reestablishment of communication re-connection can also be facilitated when the main unit 16 and the sub units 26 both store connection information and voltage monitor information and use the stored information at a time of re-connection.

Moreover, power can be saved when the battery ECU 10 and the voltage monitors 20 are placed in a sleep mode in response to the power switch 70 being turned OFF. On the other hand, since the storage units 17 and 27 are continuously activated even in a sleep mode, it is satisfactory to have only a volatile memory, without the necessity of having a nonvolatile memory. In addition, since the storage units 17 and 27 are continuously activated even in a sleep mode, communication re-connection can be smoothly reestablished without the necessity of activating the storage units 17 and 27 at a second operation or later. Furthermore, since information in the storage units 17 and 27 is updated every time the power switch 70 is turned OFF, information error, in which information in the storage units 17 and 27 is not updated despite connection information and voltage monitor information actually having been updated, can be prevented.

Second Embodiment

Next, a battery monitoring apparatus 52 according to a second embodiment will be described. It is noted that in the following embodiments, a member or the like that is the same as or corresponds to that in the previous embodiment is assigned with the same reference sign. However, a battery monitoring apparatus itself is assigned with a different reference sign in each embodiment. For the present embodiment, points different from the first embodiment will be primarily described.

Figure 5:
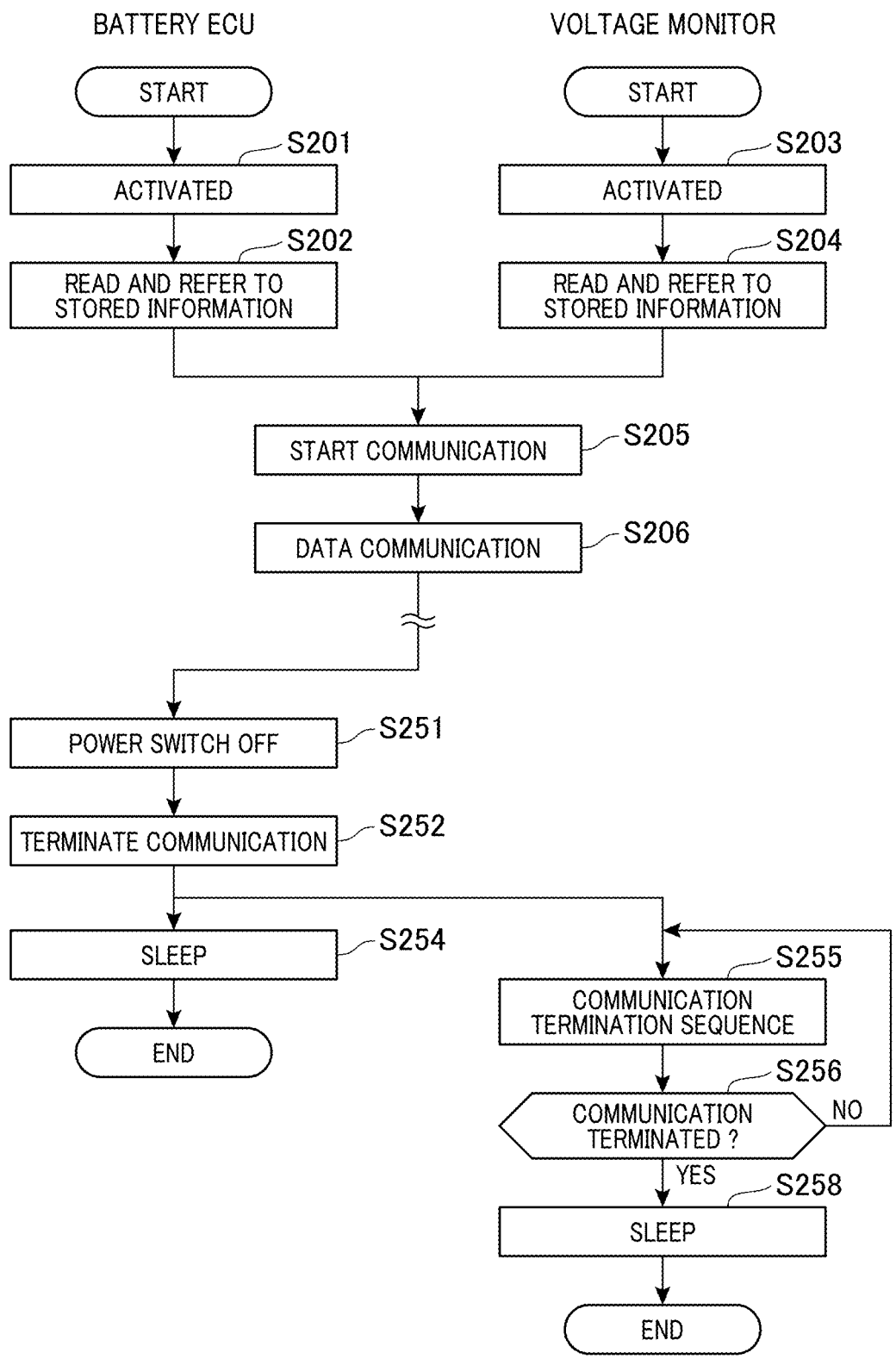
FIG. 5 is a flowchart illustrating a processing flow at a second operation or later in a second embodiment.

FIG. 5 is a flowchart illustrating control of the battery monitoring apparatus 52 at a second operation or later. The present embodiment is different from the first embodiment, in that immediately before sleeping (S254 and S258), the main unit 16 and the sub units 26 do not store connection information and voltage monitor information in the storage units 17 and 27, that is, do not update connection information and voltage monitor information in the storage units 17 and 27.

According to the present embodiment, the time and labor for updating information stored in the storage units 17 and 27 can be saved at the end of a second operation or later, although there is the risk of information error.

Third Embodiment

Figure 6:
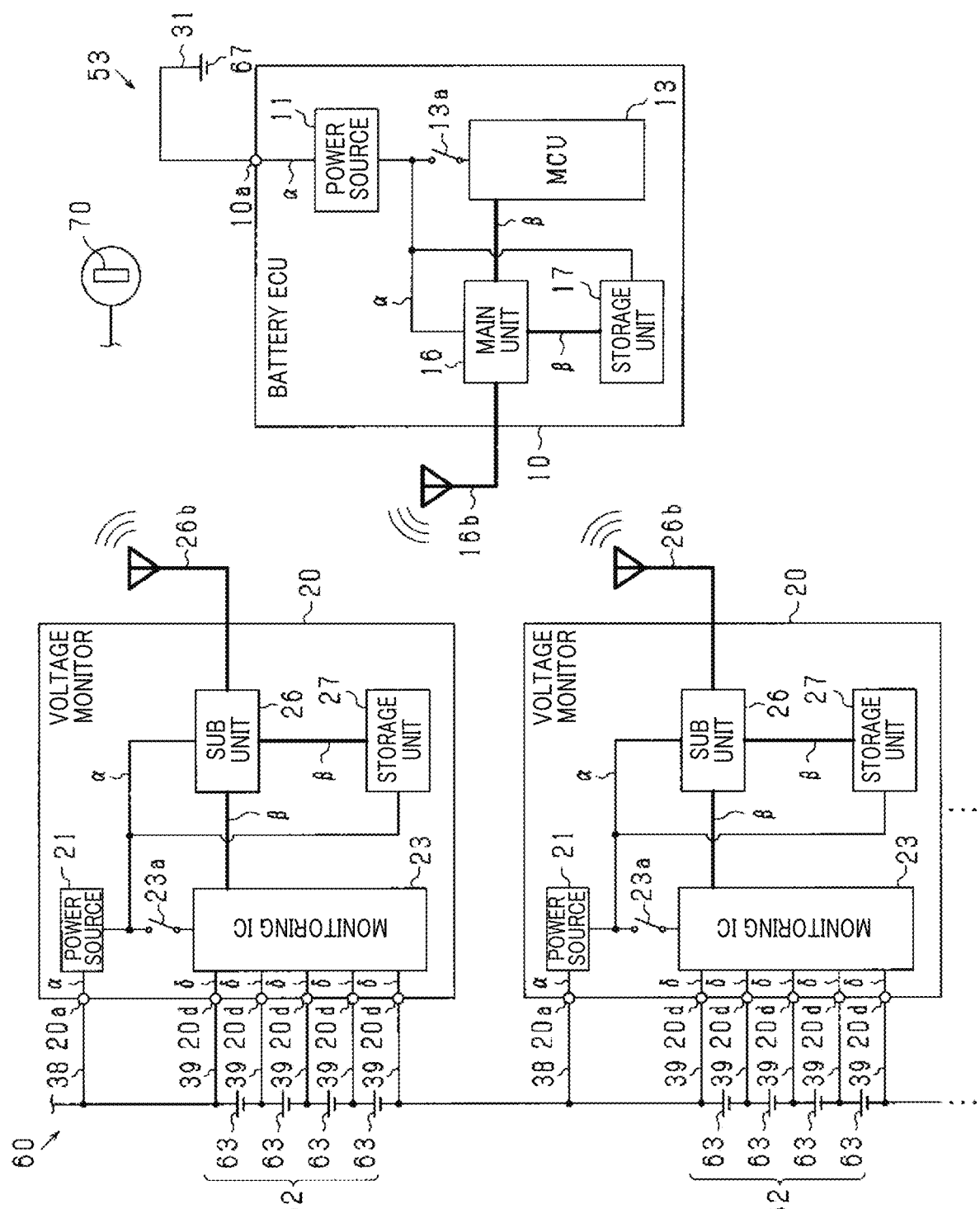
FIG. 6 is a circuit diagram illustrating a battery monitoring apparatus according to a third embodiment.

FIG. 6 is a circuit diagram illustrating a battery monitoring apparatus 53 according to a third embodiment. For the present embodiment, points different from the first embodiment will be primarily described. The main unit 16 is not provided with the power switch 16a, and power is always supplied to the main unit 16. Therefore, the battery ECU 10 is configured such that in response to the power switch 70 being turned OFF, only the power switch 13a of the MCU 13 is turned OFF, and the main unit 16 and the storage unit 17 are continuously activated.

In addition, each sub unit 26 is not provided with the power switch 26a, and power is always supplied to each sub unit 26. Therefore, each voltage monitor 20 is configured such that in response to the power switch 70 being turned OFF, only the power switch 23a of the monitoring IC 23 is turned OFF, and the sub unit 26 and the storage unit 27 are continuously activated.

Figure 7:
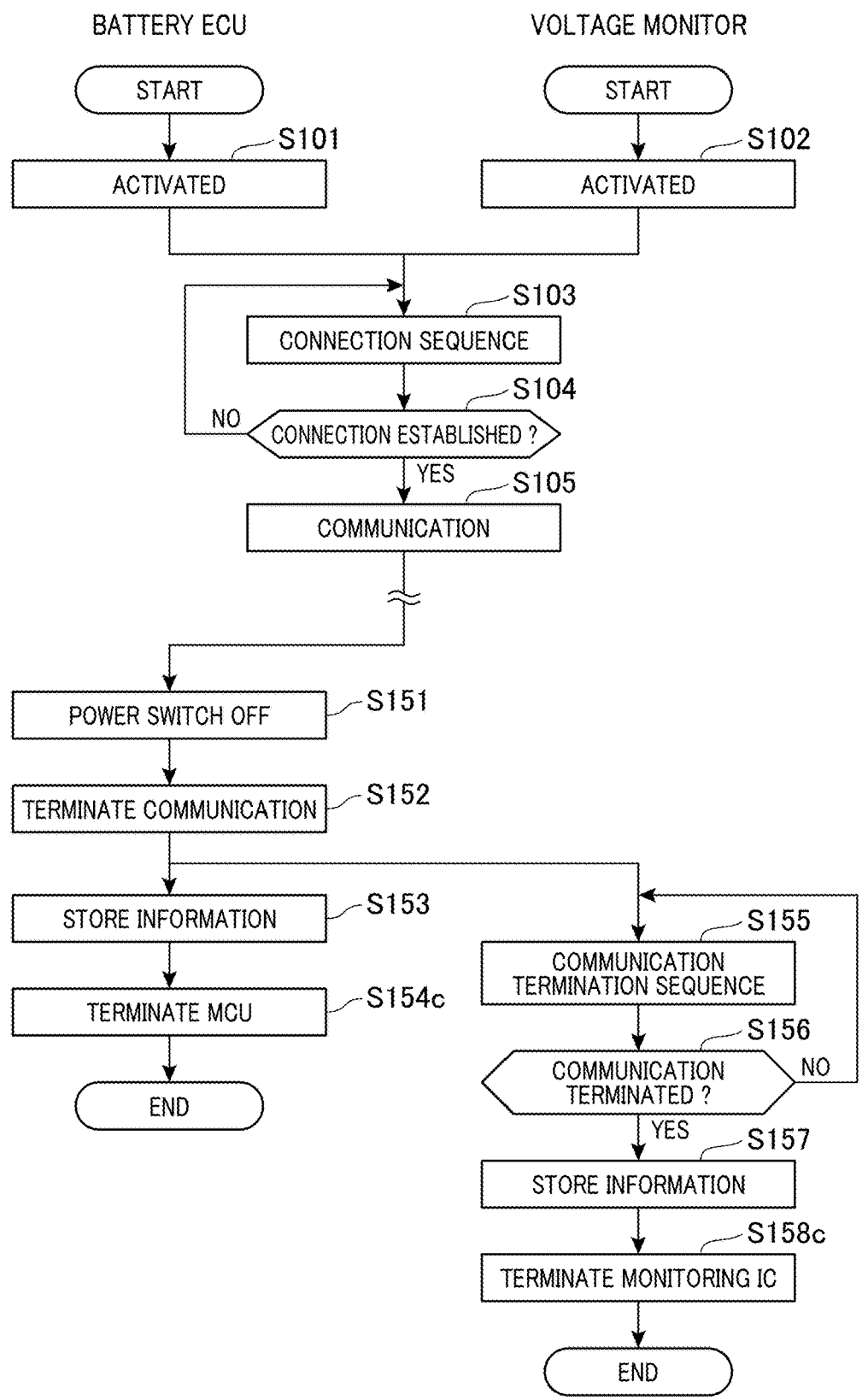
FIG. 7 is a flowchart illustrating a processing flow at an initial operation.

FIG. 7 is a flowchart illustrating control of the battery monitoring apparatus 53 at an initial operation. After the main unit 16 stores information in the storage unit 17 (S153), the battery ECU 10 is not placed in a sleep mode and terminates only the activation of the MCU 13 (S154c). In addition, after each sub unit 26 stores information in the corresponding storage unit 27 (S157), the voltage monitor 20 is not placed in a sleep mode and terminates only the activation of the monitoring IC 23 (S158c). After storing information, the main unit 16 and each sub unit 26 perform communication for every prescribed period to maintain communication connection.

Figure 8:
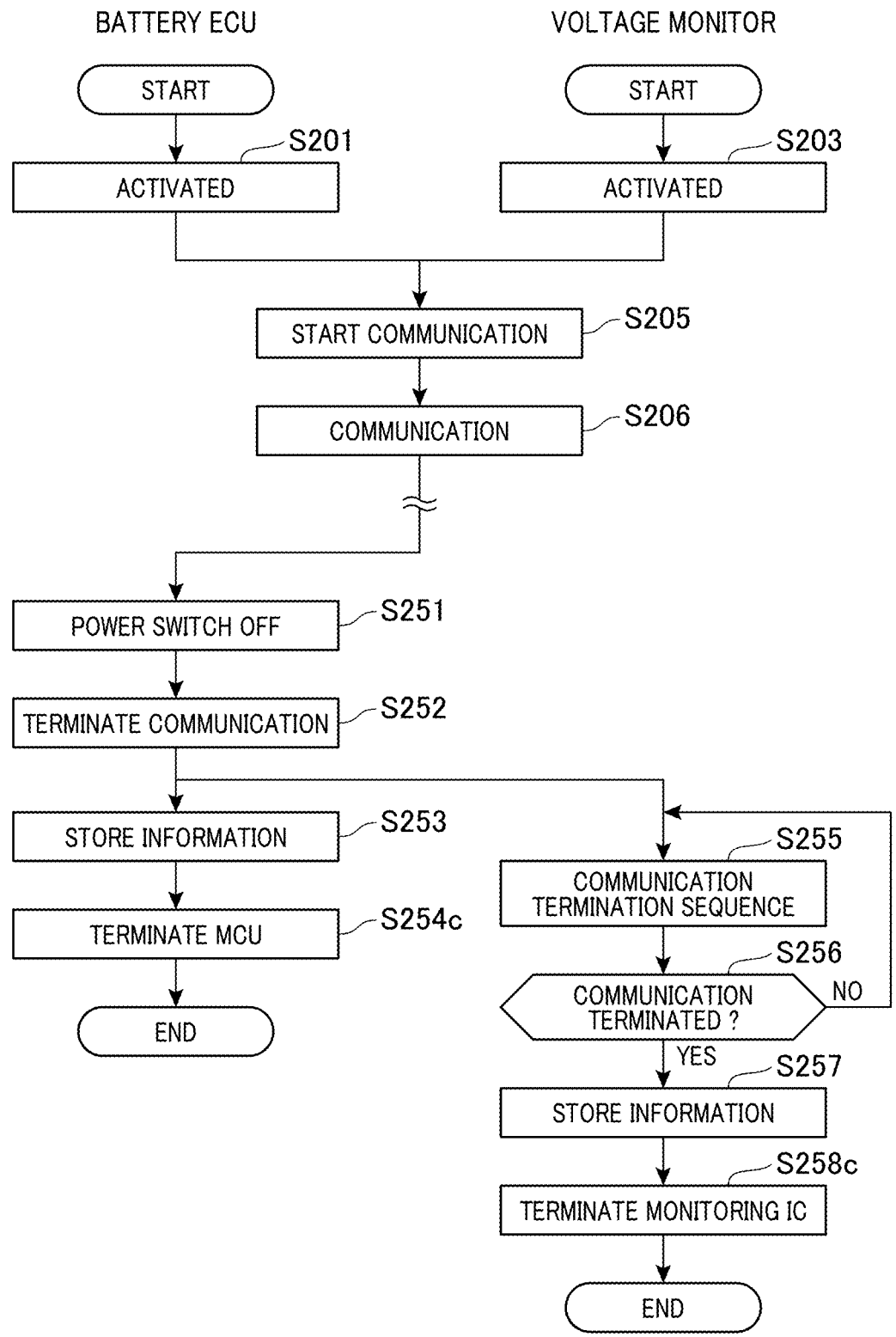
FIG. 8 is a flowchart illustrating a processing flow at a second operation or later.

FIG. 8 is a flowchart illustrating control of the battery monitoring apparatus 53 at a second operation or later. In response to the power switch 70 being turned ON, the battery ECU 10 is activated (S201), while the voltage monitors 20 are activated (S203). Then, the main unit 16 and the sub units 26 start wireless communication through the maintained communication connection, without performing the connection sequence as performed at the initial operation (S205). Then, wireless communication is maintained (S206).

The processing flow (S251 to S253, S254c, S255 to S257, and S258c) in response to the power switch 70 being turned OFF is the same as at the initial operation (S151 to S153, S154c, S155 to S157, and S158c).

According to the present embodiment, wireless communication is performed by the maintained communication connection, which enables wireless communication to be more smoothly restarted.

Figure 9:
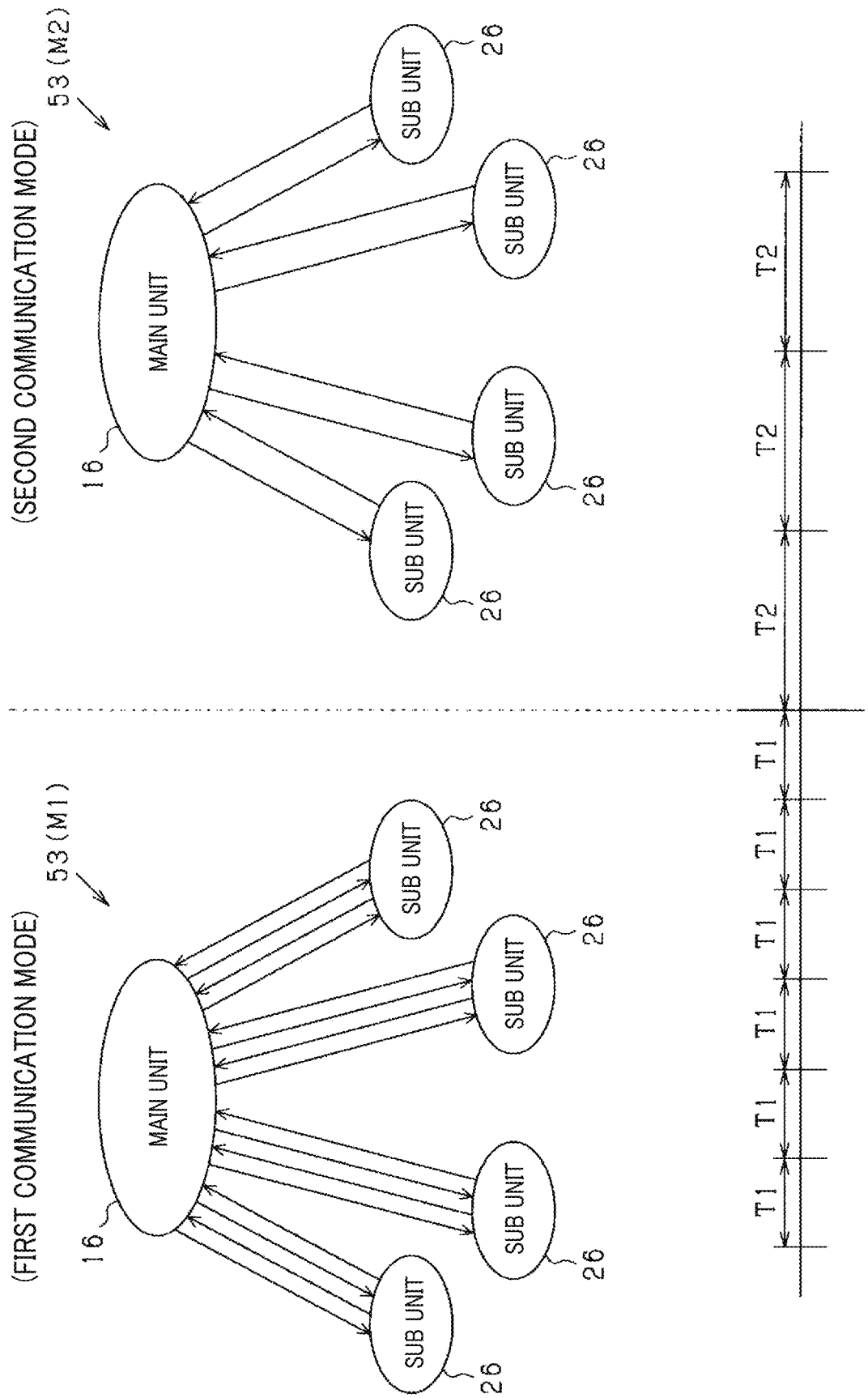
FIG. 9 is a schematic diagram illustrating a first communication mode and a second communication mode.

In addition, in the present embodiment, communication is performed for every prescribed period while maintaining communication connection, after communication is terminated in S152 and S156 at the initial operation illustrated in FIG. 7 and after communication is terminated in S252 and S256 at the second operation or later illustrated in FIG. 8, as described above. Therefore, in other words, as illustrated in FIG. 9, the wireless device performs wireless communication between the main unit 16 and the sub units 26 in a prescribed first communication mode M1 while the power switch 70 is ON, and in a second communication mode M2, whose power consumption is smaller than the first communication mode M1, while the power switch 70 is OFF. Therefore, while the power switch 70 is OFF, communication connection can be maintained with reduced power consumption by the second communication mode M2.

More specifically, the sub units 26 wirelessly communicate with the main unit 16 for a prescribed first communication period T1 in the first communication mode M1, and the sub units 26 wirelessly communicate with the main unit 16 for a second communication period T2, which is longer than the first communication period T1, in the second communication mode M2. Therefore, in the second communication mode M2, the communication period is longer, which enables the reduction of power consumption and the maintenance of communication connection to be efficiently balanced.

In addition, in the present embodiment, wireless communication is maintained by the second communication mode M2 even while the power switch 70 is OFF, with the result that the timer of the main unit 16 and the timers of the sub units 26 are synchronized even while the power switch 70 is OFF. The timers are configured such that in wireless communication, the main unit 16 and each sub unit 26 synchronize the transmission timing of themselves and the reception timing of the other followed by synchronizing the transmission timing of the other and the reception timing of themselves. Therefore, in response to the power switch 70 being turned from OFF to ON, wireless communication by the first communication mode M1 can be smoothly restarted using already synchronized timers, without synchronizing the timers between the main unit 16 and the sub units 26 again.

Fourth Embodiment

Next, a battery monitoring apparatus 54 according to a fourth embodiment will be described. For the fourth embodiment, points different from the third embodiment will be primarily described.

Figure 10:
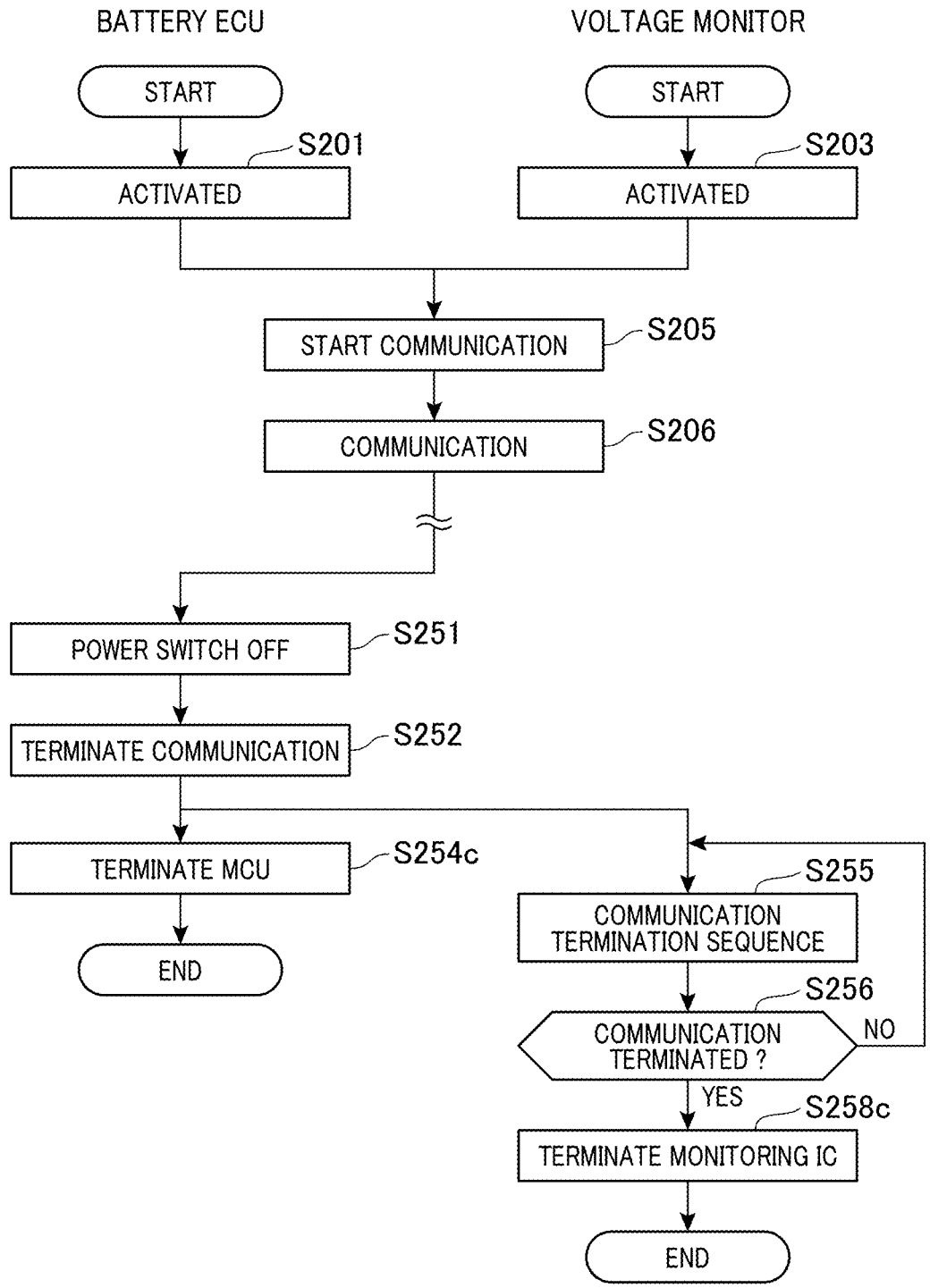
FIG. 10 is a flowchart illustrating a processing flow at a second operation or later in a fourth embodiment.

FIG. 10 is a flowchart illustrating control of the battery monitoring apparatus 54 at a second operation or later. The present embodiment is different from the third embodiment, in that after terminating communication with the sub units 26 (S252), the main unit 16 does not store connection information and voltage monitor information in the storage unit 17, that is, does not update connection information and voltage monitor information in the storage unit 17. In addition, the present embodiment is different from the third embodiment, in that after terminating communication with the main unit 16 (S256), the sub units 26 do not store connection information and voltage monitor information in the corresponding storage units 27, that is, do not update connection information and voltage monitor information in the corresponding storage units 27.

According to the present embodiment, the time for updating information stored in the storage units 17 and 27 can be saved at the end of a second operation or later, although there is a risk of information error.

Fifth Embodiment

Next, a battery monitoring apparatus 55 according to a fifth embodiment will be described. For the present embodiment, points different from the third embodiment will be primarily described.

Figure 11:
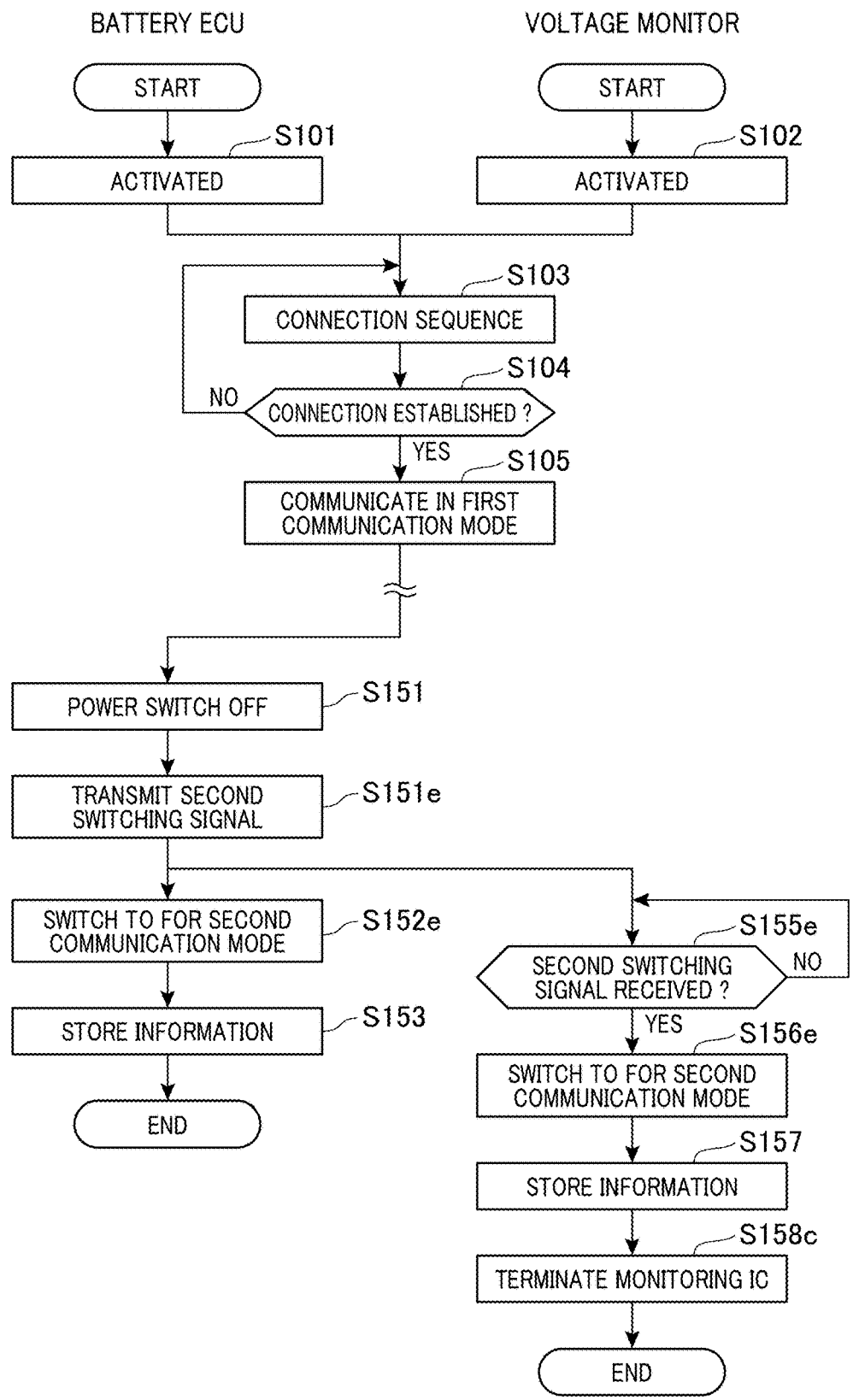
FIG. 11 is a flowchart illustrating a processing flow at an initial operation in a fifth embodiment.

FIG. 11 is a flowchart illustrating control of the battery monitoring apparatus 53 at an initial operation. In response to the power switch 70 being turned ON, the battery ECU 10 is activated (S101), while the voltage monitors 20 are also activated (S102). Thereafter, the main unit 16 and the sub units 26 perform a connection sequence (S103) to establish communication connection. At this time, the main unit 16 and the sub units 26 synchronize their timers. Next, it is determined whether the main unit 16 and the sub units 26 have established communication connection (S104). In response to determining that communication connection has not been established (S104: NO), the connection sequence in S103 is performed again. On the other hand, in response to determining that communication connection has been established (S104: YES), wireless communication by the first communication mode M1 is performed between the main unit 16 and the sub units 26 (S105).

Thereafter, in response to the power switch 70 being turned OFF (S151), an elapsed time therefrom is measured by the main unit 16 with its own timer. In response to the elapsed time reaching a prescribed time, that is, after a prescribed time has elapsed since the power switch 70 was turned OFF, the main unit 16 transmits a second switching signal to instruct the sub units 26 to switch to the second communication mode M2, through the current wireless communication by the first communication mode M1 (S151e), while switching its own state from the state for the first communication mode M1 to the state for the second communication mode M2 (S152e). Thereafter, the battery ECU 10 stores connection information and voltage monitor information in the storage unit 17 (S153).

On the other hand, each sub unit 26 determines whether it has received the second switching signal (S155e). In response to failing to determine that the second switching signal has been received (S155e: NO), the determination in S155e is repeated. On the other hand, in response to determining that the second switching signal has been received in S155e (S155e: YES), the sub unit 26 switches its own state from the state for the first communication mode M1 to the state for the second communication mode M2 (S156e). Accordingly, the communication mode between the main unit 16 and the sub unit 26 switches from the first communication mode M1 to the second communication mode M2. Thereafter, each voltage monitor 20 stores information such as connection information and voltage monitor information in the corresponding storage unit 27 (S157), while terminating the activation of the monitoring IC 23 (S158c).

Thereafter, the main unit 16 and the sub unit 26 maintain communication connection through the wireless communication by the second communication mode M2. In the second communication mode M2, the timers of the main unit 16 and the sub unit 26 are continuously synchronized by exchanging timer information between the main unit 16 and the sub unit 26. In addition, at a prescribed time, the sub unit 26 transmits voltage information of the unit batteries 63 to the main unit 16.

Figure 12:
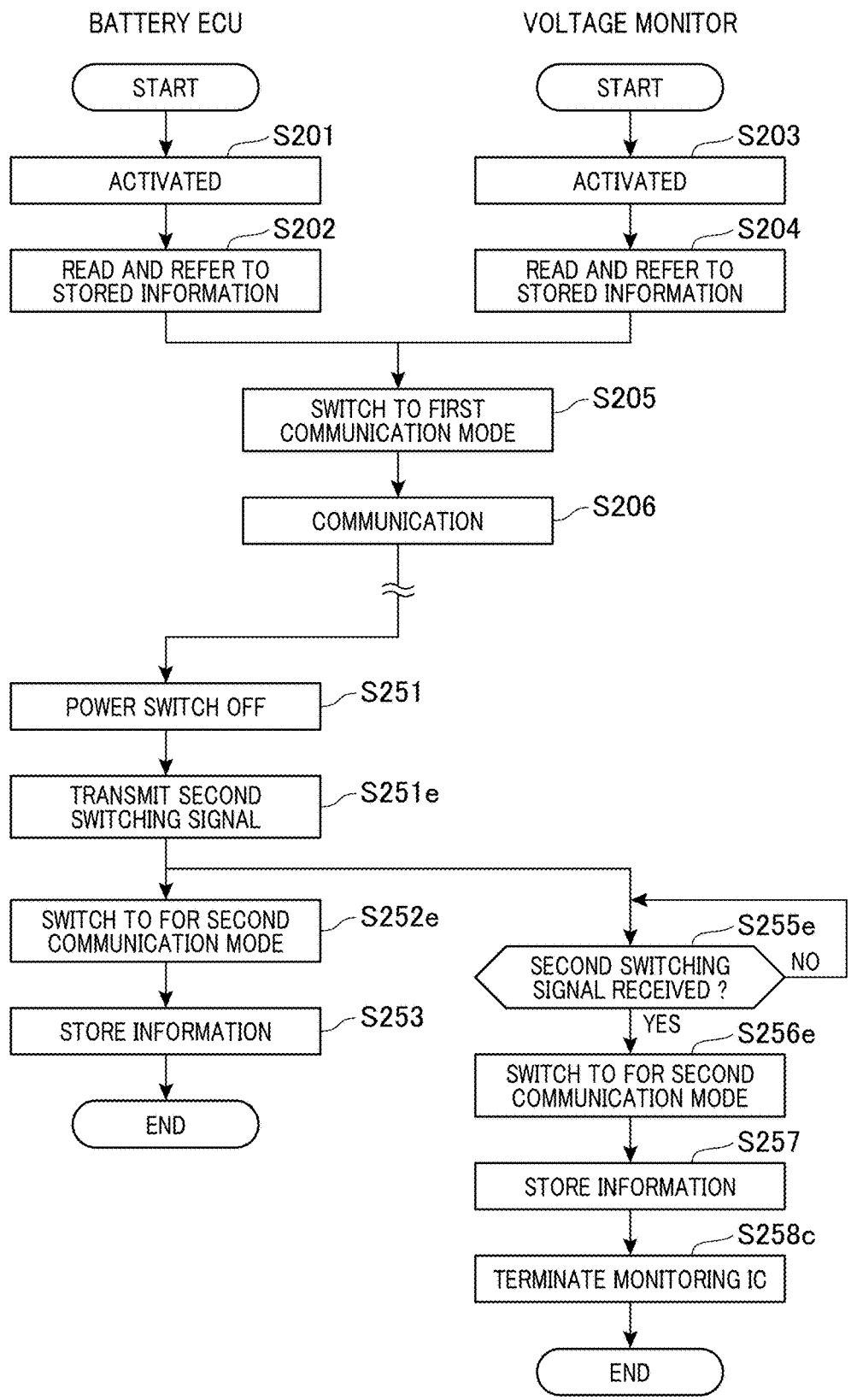
FIG. 12 is a flowchart illustrating a processing flow at a second operation or later.

FIG. 12 is a flowchart illustrating control of the battery monitoring apparatus 53 at a second operation or later. In response to the power switch 70 being turned ON, the battery ECU 10 is activated (S201), while the voltage monitors 20 are activated (S203). The main unit 16 reads information stored in the storage unit 17 of the battery ECU 10 (S202), and each sub unit 26 reads information stored in the storage unit 27 of the corresponding voltage monitor 20 (S204). Then, the main unit 16 and the sub unit 26 switch from the second communication mode M2 to the first communication mode M1 (S205) using the read information and the maintained communication connection by the second communication mode M2, without performing the connection sequence and the timer synchronization as performed at the initial operation.

Specifically, in S205, the main unit 16 transmits a first switching signal to instruct the sub units 26 to switch to the first communication mode M1 through the current wireless communication by the second communication mode M2. Then, the main unit 16 switches its own state from the state for the second communication mode M2 to the state for the first communication mode M1. At this time, the main unit 16 refers to information read from the storage unit 17. On the other hand, in response to receiving the first switching signal, each sub unit 26 switches its own state from the state for the second communication mode M2 to the state for the first communication mode M1. At this time, the sub unit 26 refers to information read from the storage unit 27. In this manner, the communication mode between the main unit 16 and each sub unit 26 switch from the second communication mode M2 to the first communication mode M1 (S205). Then, the main unit 16 and each sub unit 26 wirelessly communicate by the first communication mode M1 (S206).

The subsequent control (S251, S251e, S252e, S253, S255e, S256e, S257, and S258c) in response to the power switch 70 being turned OFF is the same as at the initial operation (S151, S151e, S152e, S153, S155e, S156e, S157, and S158c).

According to the present embodiment, the following effects are obtained. For switching from the second communication mode M2 to the first communication mode M1, the main unit 16 and each sub unit 26 use the corresponding voltage monitor information stored in the storage units 17 and 27 to establish the switching. Therefore, even when voltage monitor information is required for the switching, the switching can be smoothly reestablished.

In addition, in the second communication mode M2, each sub unit 26 transmits voltage information of the unit batteries 63 to the main unit 16 at times. Therefore, if the voltage information changes while the power switch 70 is OFF, the battery ECU 10 can start processing with updated voltage information in response to the power switch 70 being turned ON.

In addition, in response to a prescribed time having elapsed after the power switch 70 was turned OFF, the first communication mode M1 is switched to the second communication mode M2. Therefore, the switching can be simply and timely performed. In addition, the prescribed time is measured by the timers. Therefore, switching from the first communication mode M1 to the second communication mode M2 can be simply and timely performed using the timers.

In addition, the second switching signal is transmitted through the communication by the first communication mode M1 thereby to switch to the second communication mode M2, whereas the first switching signal is transmitted through the communication by the second communication mode M2 thereby to switch to the first communication mode M1. Therefore, the current communication modes M1 and M2 can be used to simply switch to the other communication modes M2 and M1.

Sixth Embodiment

Next, a battery monitoring apparatus 56 according to a sixth embodiment will be described. For the present embodiment, points different from the fifth embodiment will be primarily described. The first communication mode M1 is the same as in the fifth embodiment. Therefore, in the first communication mode M1, separate communication is performed in which the main unit 16 separately transmits signals to the sub units 26.

FIG. 13 is a schematic diagram illustrating a second communication mode M2 according to the present embodiment. In the second communication mode M2, broadcast communication is performed in which the main unit 16 transmits one broadcast signal to the plurality of sub units 26. The broadcast signal contains a prescribed handling signal and the above-described first switching signal. The handling signal is a signal to be transmitted for prescribed periods while the power switch 70 is OFF, and contains information for synchronizing timers between the main unit 16 and the sub units 26. As described above, the first switching signal is transmitted in response to the power switch 70 switching from OFF to ON. The main unit 16 may transmit the broadcast signal, immediately at, for example, the switching of the communication mode, or according to a schedule previously set between the main unit 16 and the sub units 26.

The sub units 26, for example, check synchronization between the timers, by sequentially returning signals to the main unit 16 at different times after reception of the handling signal. Furthermore, at a prescribed timing, each sub unit 26 returns voltage information of the unit batteries 63 to the main unit 16, after reception of the handling signal. It is noted that although each broadcast signal preferably has a short output time from the viewpoint of consumption power and immediate state transition, it may be continuously output for a certain time or for certain periods, so that all the sub units 26 can reliably receive the broadcast signal.

According to the present embodiment, in the second communication mode M2, broadcast communication is performed in which the main unit 16 transmits one broadcast signal to the plurality of sub units 26. Therefore, the reduction of power consumption and the maintenance of communication connection can be efficiently balanced. In addition, the sub units 26 sequentially return signals to the main unit 16 at different times after reception of the handling signal in the broadcast signal. Therefore, interference between signals can be prevented compared to when signals are returned simultaneously. Furthermore, such prevention of the interference between signals can reduce power with which the sub units 26 return signals.

Other Embodiments

The above-described embodiments can be modified and carried out in the following manner. For example, the voltage monitor information stored in the storage units 17 and 27 may be based on only one or two of the above-described number information, position information, and period information. Specifically, the voltage monitor information may be based on at least the number information. In addition, the voltage monitor information may be based on at least the position information. In addition, the voltage monitor information may be based on at least the period information. In addition, the voltage monitor information may be based on at least the number information and the position information. In addition, the voltage monitor information may be based on at least the number information and the period information. In addition, the voltage monitor information may be based on at least the position information and the period information.

The storage unit 17 or 27 may be disposed to at least one of the battery ECU 10 and each voltage monitor 20 and not disposed to the other. Specifically, for example, the storage unit 17 may be disposed to only the battery ECU 10, and the storage unit 27 may not be disposed to each voltage monitor 20. Then, the sub units 26 may wirelessly receive connection information and voltage monitor information from the main unit 16. In addition, for example, in a case in which the storage unit 17 is disposed only to the battery ECU 10, each sub unit 26 may not wirelessly receive connection information and voltage monitor information from the main unit 16. In this case, connection processing with each sub unit 26 performed in the main unit 16 can also be omitted.

In addition, for example, only one of the voltage monitors 20 may include the storage unit 27, and the battery ECU 10 and the others of the voltage monitors 20 may not include the storage unit 17 or 27. Then, the main unit 16 and the others of the sub units 26 may wirelessly receive connection information and voltage monitor information from the sub unit 26 in the voltage monitor 20 including the storage unit.

In addition, for example, instead of being activated in response to activation of the power switch 70, the battery ECU 10 and the voltage monitors 20 may start activation in response to previous reception of signals or the like. In addition, for example, the storage units 17 and 27 may be mounted with a nonvolatile memory so as to terminate activation in response to the power switch 70 being turned OFF.

In addition, for example, in the third to sixth embodiments, the storage units 17 and 27 may not be included. Even in this case, at a second operation or later, wireless communication can be smoothly restarted by performing wireless communication through the maintained communication connection. That is, wireless communication in the first communication mode M1 can be smoothly restarted by the maintained communication connection in the second communication mode M2.

In addition, for example, in the fifth and sixth embodiments, the battery ECU 10 may terminate activation of the MCU 13, in response to the power switch 70 being turned OFF, that is, after S153 in FIG. 11. In addition, for example, in the fifth and sixth embodiments, each sub unit 26 may not transmit voltage information of the unit batteries 63 to the main unit 16 in the second communication mode M2. In addition, for example, in the fifth and sixth embodiments, only the main unit 16 may unilaterally transmit signals to the sub units 26, and the sub units 26 may not return signals to the main unit 16, in the second communication mode M2. In addition, for example, in the sixth embodiment, the sub units 26 may simultaneously return signals to the main unit 16.

Although the present disclosure has been described in accordance with examples, it is understood that the present disclosure is not limited to the examples and structures. The present disclosure also encompasses various variation examples or variations within the equivalent scope. In addition, various combinations and forms, and furthermore, other combinations and forms which include only one component, more than that, or less than that, to the various combinations and forms also fall within the category or conceptual scope of the present disclosure.

What is claimed is:

1. An apparatus configured to monitor a plurality of unit batteries (63) provided to a battery pack mounted on a vehicle, comprising:
   a battery ECU;
   voltage monitors to detect voltage information or connection information of the unit batteries; and
   a wireless device, wherein
   in a battery monitoring apparatus in which the wireless device includes a main unit disposed to the battery ECU and sub units disposed to the corresponding voltage monitors, and the main unit wirelessly transmits a command by the battery ECU to the sub units, and the sub units wirelessly transmit the voltage information to the main unit, in response to establishment of communication connection of wireless communication between the main unit and the sub units,
   the wireless device performs wireless communication in a prescribed first communication mode when a power switch, which is an activation switch of a power unit for running the vehicle, is ON, and performs wireless communication in a second communication mode, whose power consumption is smaller than the first communication mode M1, while the power switch is OFF.

2. The battery monitoring apparatus according to claim 1, wherein
   at least one of the battery ECU and each voltage monitor is disposed with a storage unit configured to store voltage monitor information, which are information of the voltage monitors, and
   when switching from the second communication mode to the first communication mode, the wireless device uses the voltage monitor information stored in the storage unit to establish the switching.

3. The battery monitoring apparatus according to claim 1, wherein
   the sub units perform wireless communication with the main unit for a prescribed first communication period in the first communication mode, and the sub units perform wireless communication with the main unit for a second communication period, which is longer than the first communication period, in the second communication mode.

4. The battery monitoring apparatus according to claim 1, wherein
   in the first communication mode, separate communication is performed in which the main unit separately transmits signals to the sub units, and in the second communication mode, broadcast communication is performed in which the main unit transmits each broadcast signal to a plurality of the sub units.

5. The battery monitoring apparatus according to claim 4, wherein
   a plurality of the sub units sequentially returns signals to the main unit at different times after reception of the broadcast signal.

6. The battery monitoring apparatus according to claim 1, wherein
   the sub units transmit the voltage information to the main unit in the second communication mode.

7. The battery monitoring apparatus according to claim 1, wherein
   the first communication mode is switched to the second communication mode, in response to a prescribed time having elapsed after the power switch was turned OFF.

8. The battery monitoring apparatus according to claim 7, wherein
   the main unit and the sub units have corresponding prescribed timers, and synchronize, based on the timers, a transmission timing of one of the main unit and each sub unit and a reception timing of the other main unit and each sub unit, and
   the prescribed time is measured by the timers.

9. The battery monitoring apparatus according to claim 1, wherein
   the main unit and the sub units have corresponding prescribed timers, and synchronize, based on the timers, a transmission timing of one of the main unit and each sub unit and a reception timing of the other main unit and each sub unit, and
   the timers are synchronized by exchanging information on the timers between the main unit and each sub unit, in the second communication mode.

10. The battery monitoring apparatus according to claim 1, wherein
    the main unit and the sub units have corresponding prescribed timers, and synchronize, based on the timers, a transmission timing of one of the main unit and each sub unit and a reception timing of the other main unit and each sub unit, and
    the timers are synchronized by exchanging information on the timers between the main unit and each sub unit, when the power switch is OFF.

11. The battery monitoring apparatus according to claim 1, wherein
    in response to the power switch being turned from OFF to ON, the main unit transmits a prescribed first switching signal to the sub units through wireless communication by the second communication mode, so that the second communication mode is switched to the first communication mode.

12. The battery monitoring apparatus according to claim 1, wherein
    the wireless device maintains the communication connection when the power switch is turned OFF, and when the power switch is subsequently turned ON, the wireless communication is performed using the communication connection that is maintained.

13. The battery monitoring apparatus according to claim 1, wherein
    the battery ECU includes the main unit, an MCU that performs various commands, and a storage unit that stores connection information and a voltage monitor information, which are information of the voltage monitors, and when the power switch is turned OFF, although the MCU is turned OFF, the main unit and the storage unit remain activated.

14. The battery monitoring apparatus according to claim 1, wherein
the voltage monitors include the sub units, a monitoring IC that detects the voltage information of the unit batteries, and a storage unit that stores connection information and voltage monitor information, which are information of the voltage monitors, and
when the power switch is turned OFF, although the monitoring IC is turned OFF, the sub unit and the storage unit remain activated.

15. The battery monitoring apparatus according to claim 1, wherein
the battery ECU includes the main unit, an MCU that performs various commands, and a storage unit that stores connection information and a voltage monitor information, which are information of the voltage monitors, and
the voltage monitors include sub units, a monitoring IC that detects the voltage information of the unit batteries, and the storage unit that stores connection information and a voltage monitor information, wherein
when the power switch is turned OFF, the MCU and the monitoring IC are deactivated, while the main unit and the sub units maintain communication connection by communicating every predetermined period.

16. The battery monitoring apparatus according to claim 15, wherein
when the power switch is turned ON at the second or subsequent operation, the main unit and the sub units start wireless communication without performing to connection sequence performed at the first operation by means of communication connection that is maintained by communicating every predetermined period.

17. The battery monitoring apparatus according to claim 1, wherein
the main unit and the sub units each have a timer to synchronize a transmission timing and a reception timing, and
the timer of the main unit and the timer of the sub unit are kept synchronized with even when the power switch is OFF.

18. The battery monitoring apparatus according to claim 17, wherein
when the power switch is turned ON from OFF, wireless communication is resumed using the timer of the main unit and the timer of the sub unit, which were kept synchronized even when the power switch was OFF.

19. The battery monitoring apparatus according to claim 1, wherein
the battery ECU includes the main unit, an MCU that performs various commands, and a storage unit that stores connection information and a voltage monitor information, which are information of the voltage monitors, and
the voltage monitors include sub units, a monitoring IC that detects the voltage information of the unit batteries, and the storage unit that stores connection information and voltage monitor information, wherein the main unit and the sub units perform wireless communication in a first communication period when the MCU and the monitoring IC are activated, and
when the MCU and the monitoring IC are deactivated, wireless communication is performed in a second communication period, which is longer than the first communication period.

20. The battery monitoring apparatus according to claim 1, wherein
the sub units transmit the voltage information to the main unit when the power switch is OFF.

21. The battery monitoring apparatus according to claim 1, wherein
communication interval or communication period is changed, in response to a prescribed time having elapsed after the power switch was switched.

22. The battery monitoring apparatus according to claim 1, wherein
when the power switch is OFF, the sub units do not transmit the voltage information of the unit battery to the main unit.

23. The battery monitoring apparatus according to claim 1, wherein
when the power switch is OFF, the main unit transmits signals to the sub units.

24. The battery monitoring apparatus according to claim 1, wherein
when the power switch is OFF, the sub unit do not return signals to the main unit.

25. The battery monitoring apparatus according to claim 1, wherein
when the power switch is OFF, the sub units transmit signals to the main unit.

26. The battery monitoring apparatus according to claim 1, wherein
when the power switch is OFF, a plurality of the sub units return signals to the main unit simultaneously when the main unit transmits signals to the sub units.

27. The battery monitoring apparatus according to claim 1, wherein
when the power switch is OFF, the wireless device performs wireless communication in a communication mode whose power consumption is smaller than when the power switch is ON.

28. An apparatus configured to monitor a plurality of unit batteries provided to a battery pack mounted on a vehicle, comprising:
a battery ECU;
voltage monitors to detect voltage information or connection information of the unit batteries; and
a wireless device, wherein
in a battery monitoring apparatus in which the wireless device includes a main unit disposed to the battery ECU and sub units disposed to the corresponding voltage monitors, and the main unit wirelessly transmits a command by the battery ECU to the sub units, and the sub units wirelessly transmit the voltage information to the main unit, in response to establishment of communication connection of wireless communication between the main unit and the sub units,
the wireless device consumes less power for wireless communication, in response to a prescribed time having elapsed after a power switch, which is an activation switch of a power unit for running the vehicle, was turned OFF.

* * * * *